US012215966B2

(12) United States Patent
Waqar et al.

(10) Patent No.: US 12,215,966 B2
(45) Date of Patent: Feb. 4, 2025

(54) METHODS AND SYSTEMS OF OPTICAL INSPECTION OF ELECTRONIC DEVICE MANUFACTURING MACHINES

(71) Applicant: Applied Materials, Inc., Santa Clara, CA (US)

(72) Inventors: Mohsin Waqar, Oakland, CA (US); Paul Zachary Wirth, Kalispell, MT (US); Todd James Brill, Denver, CO (US); Paul Edward Fisher, Los Altos, CA (US); Ilias Iliopoulos, Foster City, CA (US); Charles Gregory Potter, Sr., Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/247,241

(22) Filed: Dec. 4, 2020

(65) Prior Publication Data
US 2021/0172728 A1    Jun. 10, 2021

Related U.S. Application Data

(60) Provisional application No. 62/944,599, filed on Dec. 6, 2019.

(51) Int. Cl.
*G01B 11/14*       (2006.01)
*G01B 11/02*       (2006.01)
(Continued)

(52) U.S. Cl.
CPC ............ *G01B 11/14* (2013.01); *G01B 11/026* (2013.01); *G01B 11/0608* (2013.01);
(Continued)

(58) Field of Classification Search
CPC . H01L 21/68; H01L 21/681; H01L 21/67242; H01L 21/67253; H01L 21/67259; H01L 21/67288; H01L 21/67739; H01L 21/68735; H01L 21/68742; H01L 22/12; H01L 21/67737;
(Continued)

(56) References Cited

U.S. PATENT DOCUMENTS 5,864,394 A * 1/1999 Jordan, III ........... G01R 31/308
356/394
5,963,315 A * 10/1999 Hiatt ................. H01L 21/67745
356/237.3
(Continued)

FOREIGN PATENT DOCUMENTS

FR           3026481 A1 *  4/2016 ......... G01B 11/2441
KR    20080070856 A  *  7/2008
(Continued)

*Primary Examiner* — Gordon J Stock, Jr.
(74) *Attorney, Agent, or Firm* — Lowenstein Sandler LLP

(57) ABSTRACT

Implementations disclosed describe an inspection device capable of being transferred by a robot blade into a processing chamber of a manufacturing machine, the inspection device comprising an optical sensor to detect light reflected from a target located within the processing chamber, wherein the optical sensor is to output, to a processing device, a signal representative of a state of a region of a surface of the target.

14 Claims, 11 Drawing Sheets

(51) Int. Cl.
  *G01B 11/06* (2006.01)
  *G01B 11/24* (2006.01)
  *H01L 21/66* (2006.01)
  *H01L 21/67* (2006.01)
  *H01L 21/677* (2006.01)
  *H01L 21/687* (2006.01)
  *B25J 11/00* (2006.01)

(52) U.S. Cl.
  CPC .......... *G01B 11/0683* (2013.01); *G01B 11/24* (2013.01); *H01L 21/67253* (2013.01); *H01L 21/67288* (2013.01); *H01L 21/67739* (2013.01); *H01L 21/68735* (2013.01); *H01L 22/12* (2013.01); *B25J 11/0055* (2013.01)

(58) Field of Classification Search
  CPC ... G01N 21/94; B25J 11/0055; B25J 11/0095; G01B 11/02; G01B 11/022; G01B 11/024; G01B 11/026; G01B 11/028; G01B 11/06; G01B 11/0608; G01B 11/0616; G01B 11/0675; G01B 11/0683; G01B 11/14; G01B 11/16; G01B 11/161; G01B 11/24; G01B 11/30; G01B 11/303; G01B 11/306
  See application file for complete search history.

(56) References Cited

U.S. PATENT DOCUMENTS

| | | | | |
|---|---|---|---|---|
| 6,244,121 B1 * | 6/2001 | Hunter | ................. | H01L 21/681 73/866.5 |
| 6,950,181 B2 * | 9/2005 | Chen | ................ | H01L 21/67259 356/218 |
| 8,224,607 B2 | 7/2012 | Sakhare et al. | | |
| 8,688,398 B2 * | 4/2014 | Sakhare | ............ | H01L 21/67742 702/95 |
| 8,730,482 B2 * | 5/2014 | Matsudo | ............ | G01B 9/02028 356/497 |
| 10,041,868 B2 * | 8/2018 | Gottscho | ........... | H01L 21/67253 |
| 10,199,251 B2 * | 2/2019 | Sugita | ............... | H01J 37/32935 |
| 10,354,896 B2 * | 7/2019 | Sugita | ................. | G01B 11/06 |
| 10,665,490 B2 * | 5/2020 | Lee | ................... | H01L 21/67242 |
| 10,847,393 B2 * | 11/2020 | Potter | ...................... | G01B 7/14 |
| 11,075,087 B2 * | 7/2021 | Lin | ...................... | H01L 21/3065 |
| 11,264,291 B2 * | 3/2022 | Yang | .................. | H01L 21/6831 |
| 11,276,575 B2 * | 3/2022 | Nozaki | ............. | H01L 21/67115 |
| 2007/0148792 A1 * | 6/2007 | Marx | ...................... | H01L 22/12 257/E21.53 |
| 2011/0032535 A1 * | 2/2011 | Liesener | ............. | G03F 7/70633 356/511 |
| 2011/0074341 A1 * | 3/2011 | Jensen | .............. | H01L 21/67253 320/108 |
| 2016/0141154 A1 * | 5/2016 | Kamata | .................... | G01B 7/08 324/671 |
| 2016/0211165 A1 * | 7/2016 | McChesney | ...... | H01L 21/68742 |
| 2017/0032987 A1 * | 2/2017 | Lee | .................. | H01L 21/68735 |
| 2017/0053819 A1 * | 2/2017 | Richardson | ....... | H01J 37/32899 |
| 2017/0263478 A1 * | 9/2017 | McChesney et al. | .. | H01J 37/20 |
| 2018/0040460 A1 * | 2/2018 | Gottscho | ............. | H01J 37/3299 |
| 2018/0138069 A1 * | 5/2018 | Tan | ................... | H01L 21/68721 |
| 2019/0162527 A1 * | 5/2019 | Liu | ........................ | H01L 33/005 |
| 2019/0164791 A1 * | 5/2019 | Sugita | ............... | H01J 37/32642 |
| 2019/0371635 A1 * | 12/2019 | Oori | ................... | H01L 21/67259 |
| 2020/0098648 A1 * | 3/2020 | Liu | ......................... | H01L 22/12 |
| 2020/0373193 A1 * | 11/2020 | Kamp | .............. | H01L 21/68735 |
| 2020/0393242 A1 * | 12/2020 | Vishwanath | ........ | H01L 21/6833 |
| 2021/0057252 A1 * | 2/2021 | Sugita | .................... | H01L 21/681 |
| 2021/0223102 A1 * | 7/2021 | Zhao | ................. | G01N 21/8806 |
| 2021/0226182 A1 * | 7/2021 | Tung | ...................... | H01L 51/56 |
| 2022/0057323 A1 * | 2/2022 | Egan | ...................... | G01N 21/55 |

FOREIGN PATENT DOCUMENTS

| | | | | |
|---|---|---|---|---|
| KR | 20210002175 A | * | 1/2021 | |
| WO | WO-2020180607 A1 | * | 9/2020 | ............ B25J 9/1692 |
| WO | WO-2021022291 A1 | * | 2/2021 | ............ B25J 9/1692 |
| WO | WO-2021063635 A1 | * | 4/2021 | ............... G03F 1/84 |

\* cited by examiner

METHODS AND SYSTEMS OF OPTICAL INSPECTION OF ELECTRONIC DEVICE MANUFACTURING MACHINES

RELATED APPLICATION

This application claims the benefit of U.S. Provisional Patent Application Ser. No. 62/944,599, filed Dec. 6, 2019, the entire contents of which are hereby incorporated by reference herein.

TECHNICAL FIELD

This instant specification generally relates to ensuring quality control of systems used in electronic device manufacturing, such as deposition chambers. More specifically, the instant specification relates to optical inspection of various components of electronic device manufacturing machines as well as optical inspection of a correct alignment of such components relative to each other and to wafers.

BACKGROUND

Manufacturing of modern materials often involves various deposition techniques, such as chemical vapor deposition (CVD) or physical vapor deposition (PVD) techniques, in which atoms of one or more selected types are deposited on a substrate (wafer) held in low or high vacuum environments that are provided by vacuum deposition chambers. Materials manufactured in this manner may include monocrystals, semiconductor films, fine coatings, and numerous other substances used in practical applications, such as electronic device manufacturing. Many of these applications depend critically on the purity of the materials grown in the deposition chambers. The need to maintain isolation of the inter-chamber environment and to minimize its exposure to ambient atmosphere and contaminants therein gives rise to various robotic techniques of sample manipulation and chamber inspection. Improving precision, reliability, and efficiency of such robotic techniques presents a number of technological challenges whose successful resolution is crucial for continuing progress of electronic device manufacturing. This is especially important given that the demands to the quality of chamber manufacturing products are constantly increasing.

DETAILED DESCRIPTION

Figure 1A:
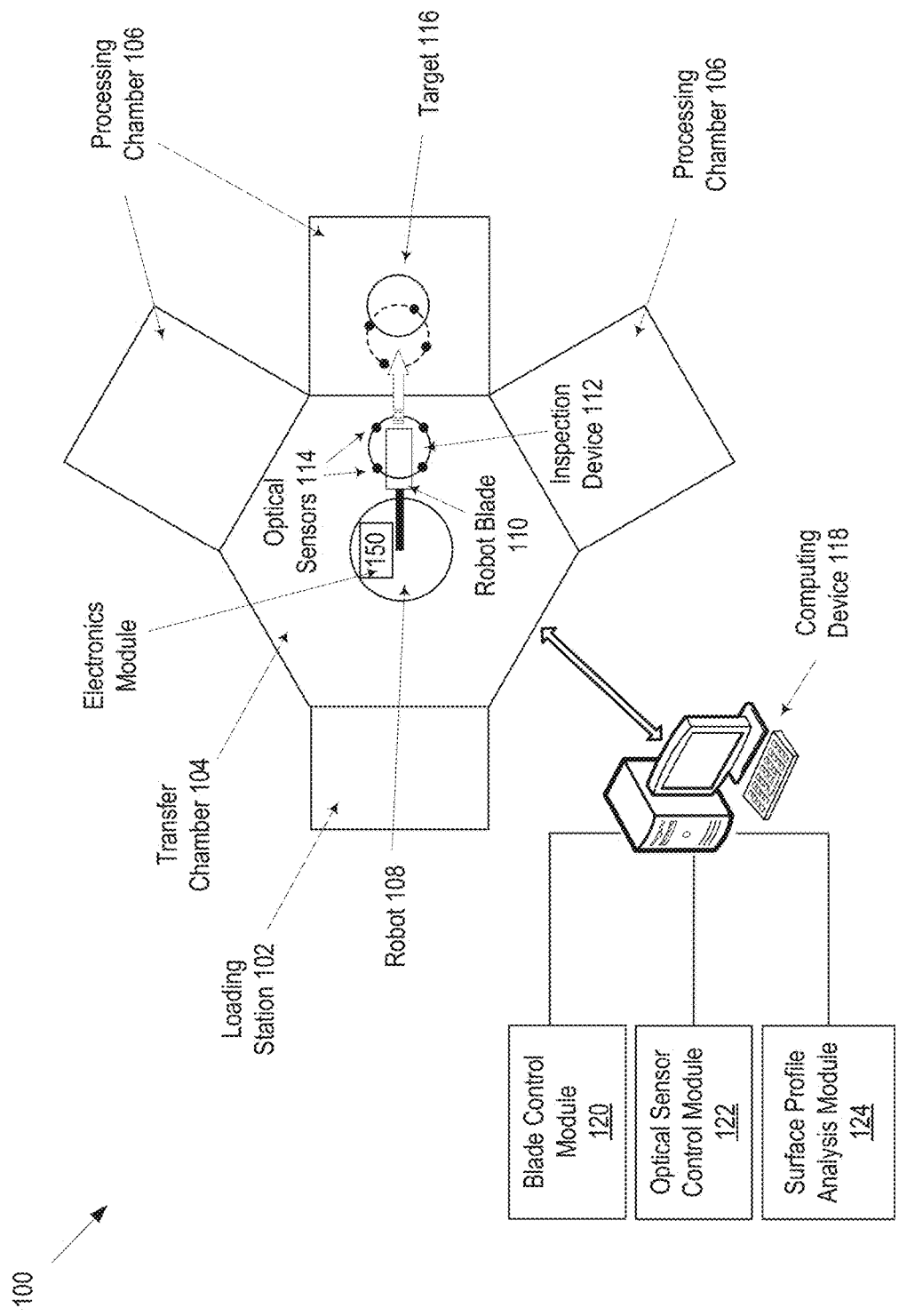
FIG. 1A illustrates one exemplary implementation of a manufacturing machine capable of supporting optical inspection of targets therein.

The implementations disclosed herein provide for contactless optical inspection with the help of light sensors of various target surfaces inside processing chambers (that may include deposition chambers, etching chambers, and so on) and alignment of various physical components (both tools and products) present inside deposition chambers. For example, the implementations disclosed may help determine an extent of deterioration of various tools used for wafer handling during manufacturing (e.g., edge rings, electrostatic chucks) and relative alignment of components (e.g., relative positioning of edge rings to chucks, wafers to chucks, wafers to edge rings, and so on).

The robotic systems require accurate calibration to be performed to set precise alignment of various components of the manufacturing process. Calibration may be required during initial installation and setup as well as for various after-installation purposes, such as maintenance, quality control, modifications of the setup, and for other reasons. In some instances, equipment (or some parts of it) may experience wear and may need to be replaced once its performance drops below a required level.

For some manufacturing equipment, such as semiconductor manufacturing chambers, it may be both time-consuming and expensive to completely or partially shut-down the equipment and the manufacturing process to perform maintenance, recalibration, and/or inspection of the equipment. Conventional methods of performing calibrations may be performed by taking the equipment off-line from normal manufacturing operations. This may require removing process gases, altering voltages, magnetic field, in-chamber pressure and/or temperature, opening the chamber, manually performing calibrations, etc. For example, a person conducting maintenance may open a lid of the chamber, place a pin or jig into a component of the processing chamber—and then manually perform calibrations between the robot handling system and the processing chamber. After calibrations have been completed, the pin or jig is physically removed, the lid of the processing chamber is closed and the processing chamber is returned on-line.

Alternatively, to minimize the time and expense of taking manufacturing equipment off-line, a disc-shaped calibrating device in the form of a wafer may be introduced into the chamber. For example, a robot can load and unload the calibrating device into the chamber. Handling the calibrating device in a precise manner may require camera technology to verify accurate alignment to various types of targets found in the manufacturing equipment. A different approach may be based on precise sensing of the start points and end points of the motion of the calibrating device and the relation of the start/end points to a target. This may be achieved by using sensors located on the calibrating device. This method may include determining (e.g., calculating) a center and/or orientation of the target based on the start points and the end points.

Precise positioning of the calibrating device relative to a target may be in some instances hindered by target wear, for example from routine manufacturing. For example, during manufacturing process, a wafer (substrate) may be placed on a wafer receiving surface and carried (e.g., by lift pins) into a region where the wafer may be subjected to a flow of deposition particles, and/or a gas or plasma used to facilitate deposition. An edge ring—often referred to as a process kit—may be used to illuminate the wafer and increase its temperature. For example, the edge ring may be located at the same level as the wafer receiving surface, so that when the wafer is lifted above the receiving surface, the wafer is also lifted above the edge ring as well. The edge ring may have an inner radius that is slightly greater than an outer radius of the wafer, so that a small gap remains between the wafer and the edge ring. A light source may illuminate a surface (e.g., a bottom surface) of the edge ring, and the surface of the edge ring may redirect (reflect) the light from the light source onto a surface (e.g., the bottom surface of the wafer). The edge ring may have a surface that is cut in a precise way so to optimize the performance of the edge ring. For example, the edge ring may have one or more recesses, ridges, flat regions designed for more efficient (e.g., uniform or, if needed, non-uniform with a particular directional dependence) illumination of the wafer.

With time and exposure to elevated temperatures, chemicals, light, and other environmental components of the inside of the chamber, the surface of the edge ring may deteriorate and the performance of the edge ring may suffer. Existing methods of robotic calibration of the tools and components of the processing chamber do not provide for examination of the surfaces of the edge rings and other target surfaces (e.g., wafer receiving surface, electrostatic chuck surface, lift pins' surfaces, and so on) while the processing chamber is in the manufacturing mode. At present, taking the processing chamber off the production line, draining it of the gases and other chemicals, opening the lid, and directly examining the target components is necessary. This may be very costly and inefficient. An operator may not be able to estimate when the target component has deteriorated to an extent that calls for its replacement. For example, in some instances, an operator may interrupt manufacturing and examine the target component only to find out that the target component is in an acceptable state and does not require a replacement. In other instances, overestimating the lifespan of the target component may result in the target component not being replaced for a substantial time after the target component has started delivering inadequate performance. For these reasons, it is desirable for chamber operators to have an inspection method (and corresponding tools) that would allow a quick and efficient way of verifying the conditions of various components of the processing chamber without taking the chamber off the manufacturing line.

Aspects and implementations of the present disclosure address this and other shortcomings of the existing technology. Described herein is an optical inspection tool capable of implementing inspection of various targets inside a processing chamber without taking the chamber off the production line. The optical inspection tool may be equipped with light sources and light sensors to detect light emitted by the light sources and reflected off a target surface being inspected by the inspection device. The inspection device may be capable of measuring a reflectance of the target surface to determine various properties of the surface, such as its morphology, quality, roughness, and so on. The inspection device may further be capable of determining the precise location of the target surface, such as the distance from the surface to the inspection device. In one implementation, where the target surface is flat, determining precise location of the target surface may include determining a single distance from the target surface to some reference point (e.g., a plane of the inspection device). In other implementations, the target surface may have a complicated profile that includes a number of ridges, recesses, kinks, grooves, flat regions, rounded regions, and so on. In such implementations, determining precise location of the target surface may include determining a detailed entire profile of the target surface. For example, the profile of the target surface may be represented by a dependence of a height (width, depth) of the target surface, counted from some reference surface (e.g., a horizontal or a vertical plane), on the distance along this reference surface. The profile may be characterized by a discrete (or a quasi-continuous) set of locations with the resolution determined by a spacing between adjacent locations. The spacing may be pre-set based on the required resolution of the target surface imaging. The desired resolution may require setting a particular speed of the inspection device and/or sampling rate of an optical sensor system mounted on the inspection device.

The disclosed implementations pertain to a variety of manufacturing techniques that use processing chambers (that may include deposition chambers, etching chambers, and the like), such as chemical vapor deposition techniques (CVD), physical vapor deposition (PVD), plasma-enhanced CVD, plasma-enhanced PVD, sputter deposition, atomic layer CVD, combustion CVD, catalytic CVD, evaporation deposition, molecular-beam epitaxy techniques, and so on. Although the most significant practical impact of the disclosed implementations may be expected to occur in techniques that use vacuum deposition chambers (e.g, ultrahigh vacuum CVD or PVD, low-pressure CVD, etc.), the same systems and methods may be utilized in atmospheric pressure deposition chambers for non-intrusive monitoring of the chamber conditions that exist during deposition processes.

FIG. 1A illustrates one exemplary implementation of a manufacturing machine 100 capable of supporting optical inspection of targets therein. In one implementation, the manufacturing machine 100 includes a loading station 102, a transfer chamber 104, and one or more processing chambers 106. The processing chamber(s) 106 may be interfaced to the transfer chamber 104 via transfer ports (not shown). The number of processing chamber(s) associated with the transfer chamber 104 may vary (with three processing chambers indicated in FIG. 1A as a way of example). The transfer chamber 104 may include a robot 108, a robot blade 110, and an inspection device 112 for optical inspection of an exemplary target 116 located in one of the processing chambers 106. The transfer chamber 104 may be held under pressure (temperature) that is higher (or lower) than the atmospheric pressure (temperature).

The robot 108 may transfer various devices (e.g., semiconductor wafers, substrates, liquid crystal displays, reticles, calibration devices) between the load station 102 and one of the processing chambers 106. The robot 108 may require calibrations for a variety of reasons including preventive maintenance, restarting or recalibrating the manufacturing machine 100, and/or replacing various components of the manufacturing machine 100.

In one implementation, the robot 108 may include a robot blade 110 to support the inspection device 112 when the inspection device is transferred into one of the processing chambers 106. The robot blade 110 may be attached to an extendable arm sufficient to move the robot blade 110 near the target 116 so that the inspection device 112 may explore one or more target surfaces of the target 116. The target 116 may be a wafer, a substrate chuck, an edge ring, or any other object/tool located in one of the processing chambers 106 (or in the loading station 102, the transfer chamber 104, the ports connecting the transfer chamber 104 to the loading station 102 or the processing chambers 106). The inspection device 112 may have one or more optical sensors 114. The inspection device 112 may include an alignment point in order to properly align the inspection device 112 relative to the robot blade 110. The alignment point may be a hole, notch, or indent and may be centered in a pocket or depression of the robot blade 110. The plurality of optical sensors 114 of the inspection device 112 may be capable of sensing visible light or other electromagnetic radiation coming from the target surface (e.g. reflected by that surface) of the target 116. The light detected by the optical sensors 114 may be reflected from the target surface where the light may be directed by one or more light sources. In some implementations, the light sources may be mounted on the same inspection device 112 (e.g., be part of the sensors 114). In other implementations, the light sources may be located outside the inspection device, e.g., mounted inside the transfer chamber 104, the loading station 102 or the processing chambers 106. The robot blade 110 and the inspection device 112 may enter the processing(s) chamber 106 through a slit valve port (not shown) while a lid to the processing chamber(s) 106 remains closed. The processing chamber(s) 106 may contain processing gases, plasma, and various particles used in deposition processes. A magnetic field may exist inside the processing chamber(s) 106. The inside of the processing chamber(s) 106 may be held at temperatures and pressures that are different from the temperature and pressure outside the processing chamber(s) 106. The temperatures and pressures inside the processing chamber(s) 106 may be similar to those that correspond to the actual on-line processing conditions.

A computing device 118 may control operations of the robot 108 and the inspection device 112. The computing device 118 may communicate with an electronics module 150 of the robot 108. In some implementations, such communication may be performed wirelessly.

Figure 1B:
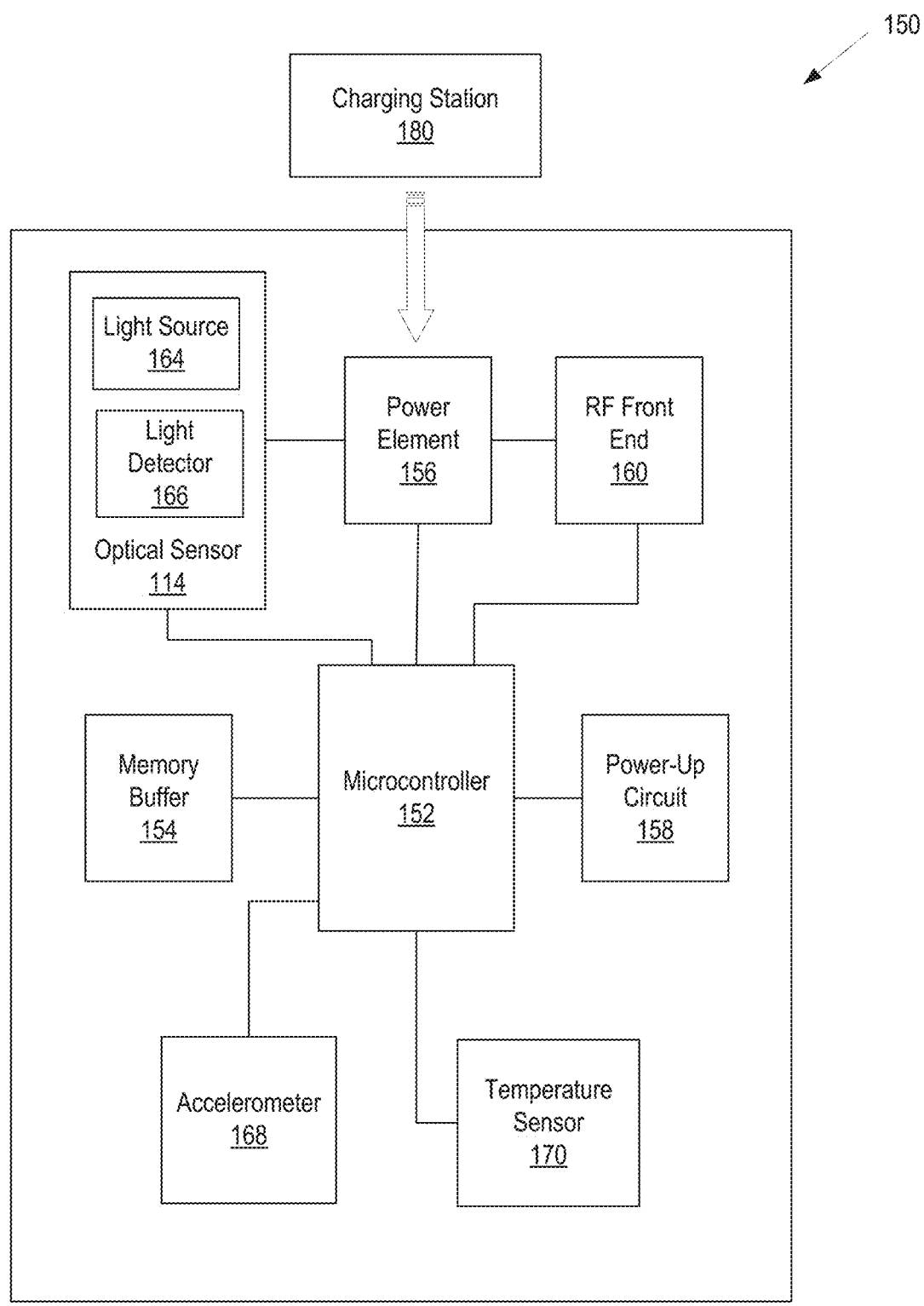
FIG. 1B illustrates the electronics module capable of facilitating optical inspection of targets inside the manufacturing machine, in one exemplary implementation.

FIG. 1B illustrates the electronics module 150 capable of facilitating wireless optical inspection of targets inside the manufacturing machine 100, in one exemplary implementation. The electronics module 150 may include a microcontroller 152 and a memory buffer 154 coupled to the microcontroller 152. The memory buffer 154 may be used to collect and store inspection data before transmitting the inspection data to the computing device 118. In some implementations, the inspection data may be transmitted using a wireless communication circuit. In other implementations, the data may be transmitted using a wired connection between the electronics module 150 and the computing device 118. In some implementations, the inspection data may first be stored (buffered) in the memory buffer 154 prior to being transmitted to the computing device 118. In other implementations, the inspection data may be transmitted to the computing device 118 as the data is collected, without being stored in the memory buffer 154. In some implementations, the wireless or wired connection may be continuous. In other implementations, the wireless or wired connection may be established periodically or upon completion of the inspection or some other triggering event (e.g., when the memory buffer 154 is close to being full). The electronics module 150 may further include a power element 156 and a power-up circuit 158. In some implementations, the power element 156 may be a battery. In some implementations, the power element 156 may be a capacitor. The power element 156 may be rechargeable from a power station 180. For example, the battery or the capacitor may be recharged upon a contact (e.g., via a charging docking station) with the power station 180 when the inspection device is withdrawn from the chamber. In some implementations, the charging station may be connected (e.g., via a wired connection) to the power element 156 even when the inspection device is inserted into the chamber. In some implementations, the connection between the charging station 180 and the power element 156 may be wireless. In some implementations, the charging station 180 may include a power transmitter and the power element 156 may include a power receiver. The wireless power transmission may be activated when the inspection device is withdrawn from the chamber, in some implementations. In other implementations, the wireless power transmission may be activated even when the inspection device is inside the chamber. When the power element 156 is low on power, the power element 156 may send a beacon signal to the find the power station 180 and the power station 180 may provide a power signal to the power element 156 until the power element is recharged to the required level.

The microcontroller 152 may be coupled to one or more optical sensors 114 (one exemplary optical sensor is depicted in FIG. 1B). The optical sensor 114 may include a light source 164 and a light detector 166. The electronics module 150 may also include an accelerometer 168 to facilitate accurate extension and angular rotation of the robot blade 110. The electronics module 150 may also include a temperature sensor 170 to detect temperature near the target 116.

The electronics module 150 may further include a wireless communication circuit, i.e. a radio circuitry for receiving wireless instructions from the computing device 118 and for transmitting optical inspection data to the computing device 118. For example, the radio circuitry may include an RF front end module 160 and an antenna 162 (e.g., a UHF antenna 162), which may be an internal ceramic antenna, in one implementation. The batteries may be of a high temperature-tolerant type such as lithium ion batteries that can be exposed to a chamber temperature of 450 degrees C. for a short time period such as one to eight minutes.

Some components shown in FIG. 1B may be located on or at the stationary part of the robot 108. For example, the microcontroller 152, the memory buffer 154, and the RF front end 160 may be so located. Other components of the electronics module 150 may be located on or at the robot blade 110 of the robot 108 and or the inspection device 112 supported by the robot blade. For example, the optical sensors 114, the accelerometer 168, and the temperature sensor 170 may be so located. In some implementations, some of the components of the electronics module 150 may be located both at the stationary part of the robot 108 and the extendable robot blade 110, e.g., power element 156 may be so located. In some implementations, two separate microcontrollers may be implemented, with one of the microcontrollers located on the stationary part of the robot 108 and the other microcontroller located on the inspection device 112.

The wireless connection facilitated by the RF front end 160 and antenna 162 may support a communication link between the microcontroller 152 and the computing device 118, in some implementations. In some implementations, the microcontroller 152 integrated with the robot 108 may have a minimal computational functionality sufficient to communicate information to the computing device 118, where most of the processing of information may occur. In other implementations, the microcontroller 152 may carry out a significant portion of computations, while the computing device 118 may provide computational support for specific, processing-intensive tasks. Data received by the computing device 118 may be data obtained from the inside of the transfer chamber 104, the processing chambers 106, data generated by the inspection device 112, data temporarily or permanently stored in the memory buffer 154, and so on. The data stored in the memory buffer 154 and/or transmitted to or from the computing device 118 may be in a raw or processed format.

Figure 8:
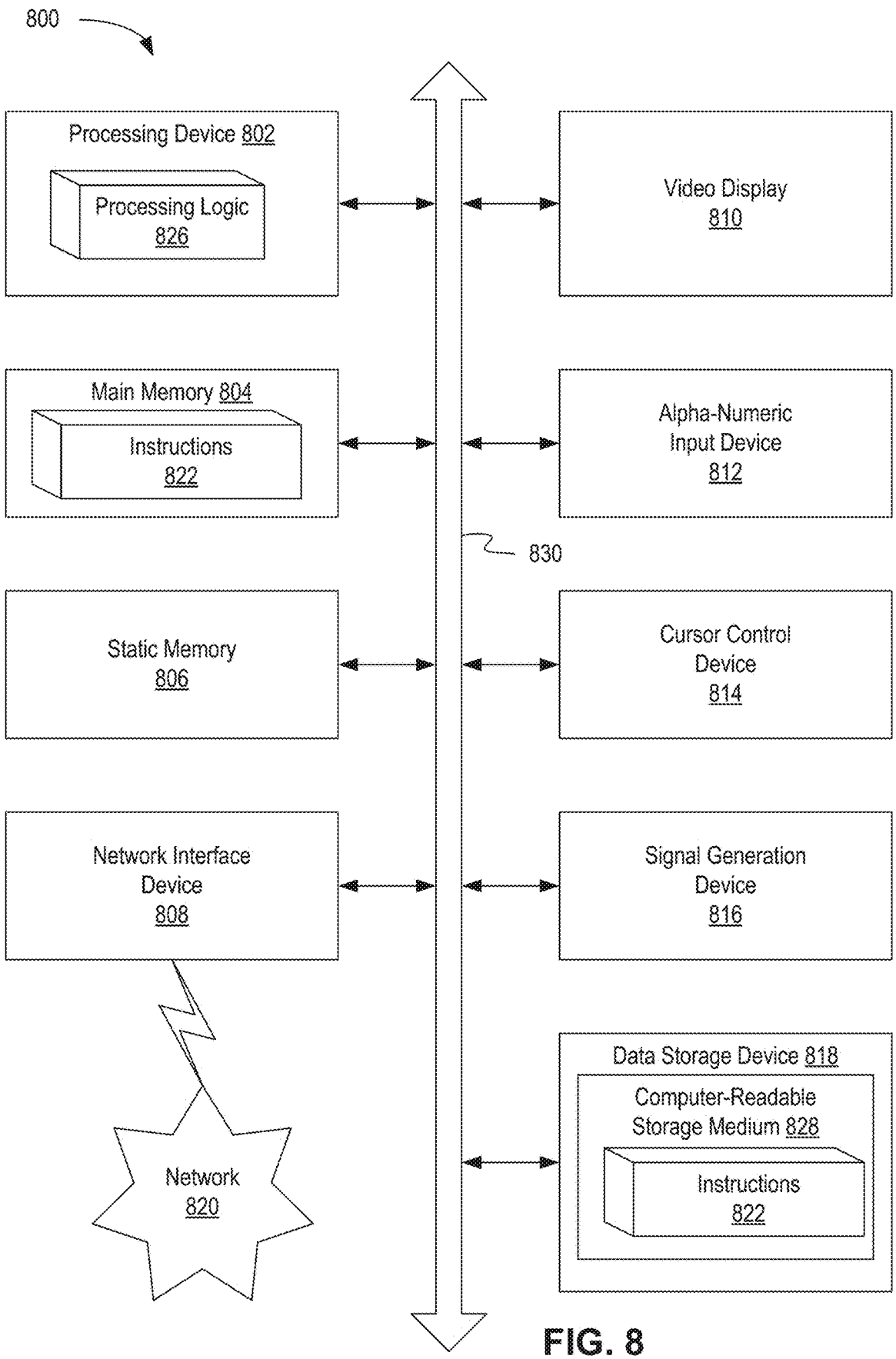
FIG. 8 depicts a block diagram of an example processing system capable of supporting real-time detection of particulate contaminants present inside a deposition chamber, based on light scattering data.

In one implementation, the inspection device 112 may determine (using the processing capabilities of the microcontroller 152 and/or the computing device 118) the instant positions of the optical sensors 114 and infer (from those positions) the locations on the target surface where the light detected by the optical sensors is coming from. Using the instant positions of the optical sensors 114, the microcontroller 152 and/or the computing device 118 may map one or more profiles (e.g., a vertical profile, a horizontal profile) of the target surface. The locations of the optical sensors relative to the target 116 (or the target surface) may be controlled via precise parallel and rotational motion of the inspection device 112. For example, as illustrated schematically in FIG. 1A, the robot blade 110 may be capable of moving the inspection device 112 to a required distance into the processing chamber 106. The robot blade 110 may further be capable of rotating the inspection device 112 to a required angle, in some implementations. As a result, one or more optical sensors 114 may be capable of hovering over (or under) any point of the surface of the target 116 and exploring one or more profiles of the target surface near that point. Upon collecting data about the target surface near a specific location, the robot blade 110 may reposition the optical sensors 114 in such a way that a different location of the target surface is in focus of the repositioned optical sensors 114. For example, the robot blade may parallel-shift the inspection device 112 by an additional distance and/or rotate the inspection device 112 by an additional angle. The microcontroller 152 (or computing device 118) may determine the coordinates of the center of the inspection device 112 as well as the angle of rotation of the inspection device 112 relative to a reference position (e.g., zero position) of the target 116. Alternatively, the computing device 118 may determine coordinates of the target 116 with respect to a reference position of the robot blade 110. The computing device may determine an offset between the center of the target 116 and the alignment point or a center line of the robot blade 110 in a reference position. The microcontroller 152 and/or computing device 118 may calibrate the robot 108 based on the determined offset. The computing device 118 of the manufacturing machine 100 may include a blade control module 120, an optical sensor control module 122, and a surface profile analysis module 124, in one implementation, as well as a central processing unit (CPU) software, and memory (as shown in FIG. 8). In some implementations, some of the functionality of the blade control module 120, the optical sensor control module 122, and the surface profile analysis module 124 may be implemented as part of the electronics module 150 by the microcontroller 152 and the memory buffer 154.

Figure 2:
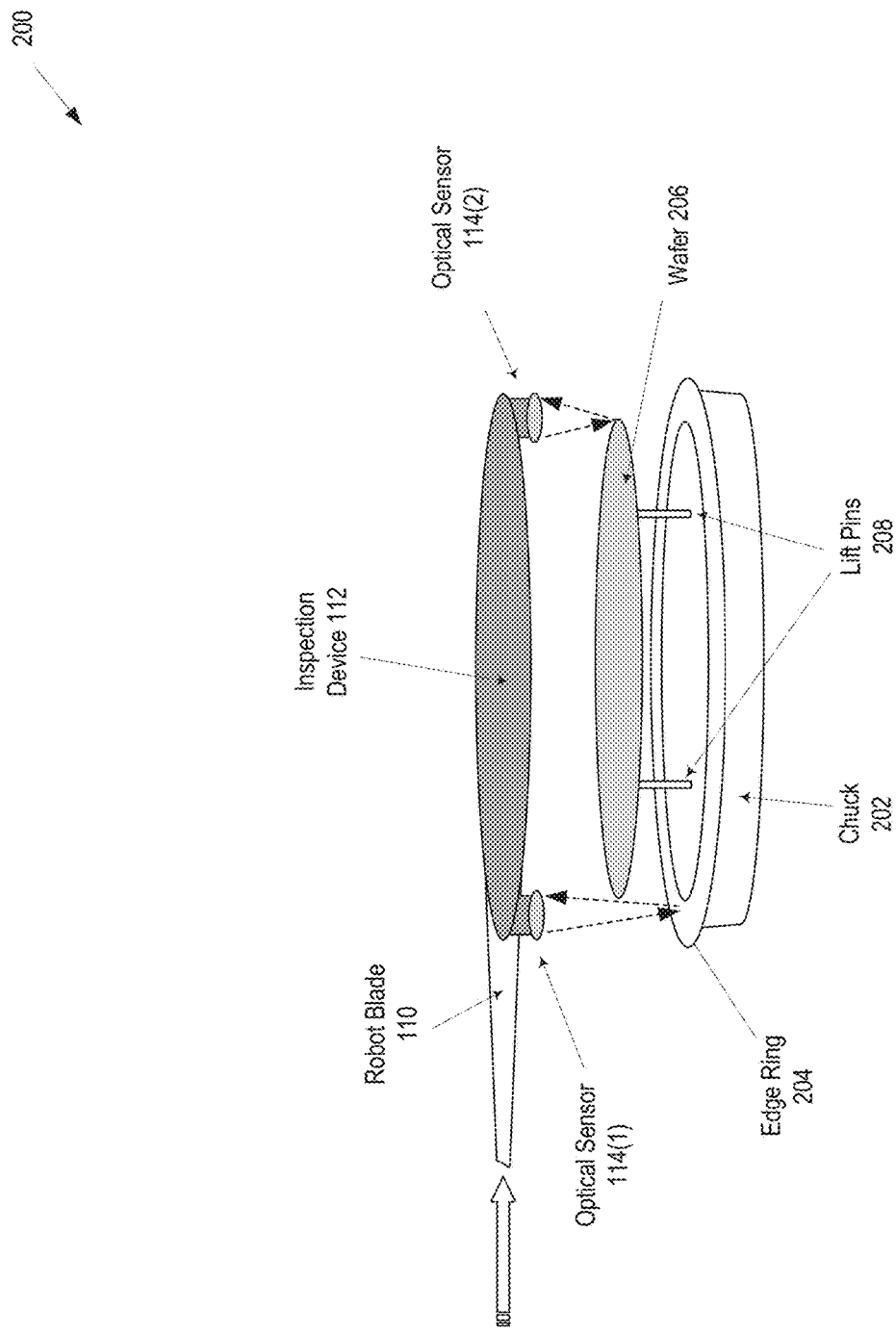
FIG. 2 illustrates an inspection device setup for performing optical inspection of targets and target surfaces within electronic device manufacturing machines, in one exemplary implementation.

FIG. 2 illustrates an inspection device setup 200 for performing optical inspection of targets and target surfaces within electronic device manufacturing machines, in one exemplary implementation. The target 116 in the setup 200 may include an electrostatic chuck 202 (also commonly referred to as pedestals or heaters) or any other tool capable of holding a wafer during a manufacturing process. The target 116 in the setup 200 may also include the edge ring 204, the wafer 206, or any other object or component of the processing chamber 106. The wafer 206 may be supported above the surface of the chuck 202 with lift pins 208. For example, the wafer may be initially placed on the wafer-receiving surface (e.g., the upper surface of the chuck 202) and subsequently lifted above that surface. In some implementations, the wafer 206 may not be present when the inspection device 112 is to inspect the target surfaces. For example, the inspection device 112 may be shaped similarly to the standard wafer 206 and placed by the robot blade 110 in the standard location of the wafer 206, e.g., on the wafer-receiving surface of the chuck 202. Furthermore, the inspection device may be handled similarly to the wafer 206, e.g., lifted above the wafer-receiving surface and/or the edge ring 204 by lift pins 208 to a height necessary or optimal for performing the optical inspection of the target surfaces.

The optical inspection may be performed using one or more optical sensors 114. For example, as illustrated in FIG. 2, the optical sensor may be used to inspect the surface of the edge ring 204 (shown schematically as performed by the sensor 114(1)). The optical sensor may be used to inspect other target surfaces or areas, such as the surface/edge of the wafer 206 (shown schematically as performed by the sensor 114(2)), the surface of the chuck 202, a gap between the chuck 202 and the edge ring 204, a gap between the edge ring 204 and the wafer 206, and so on.

Figure 3A:
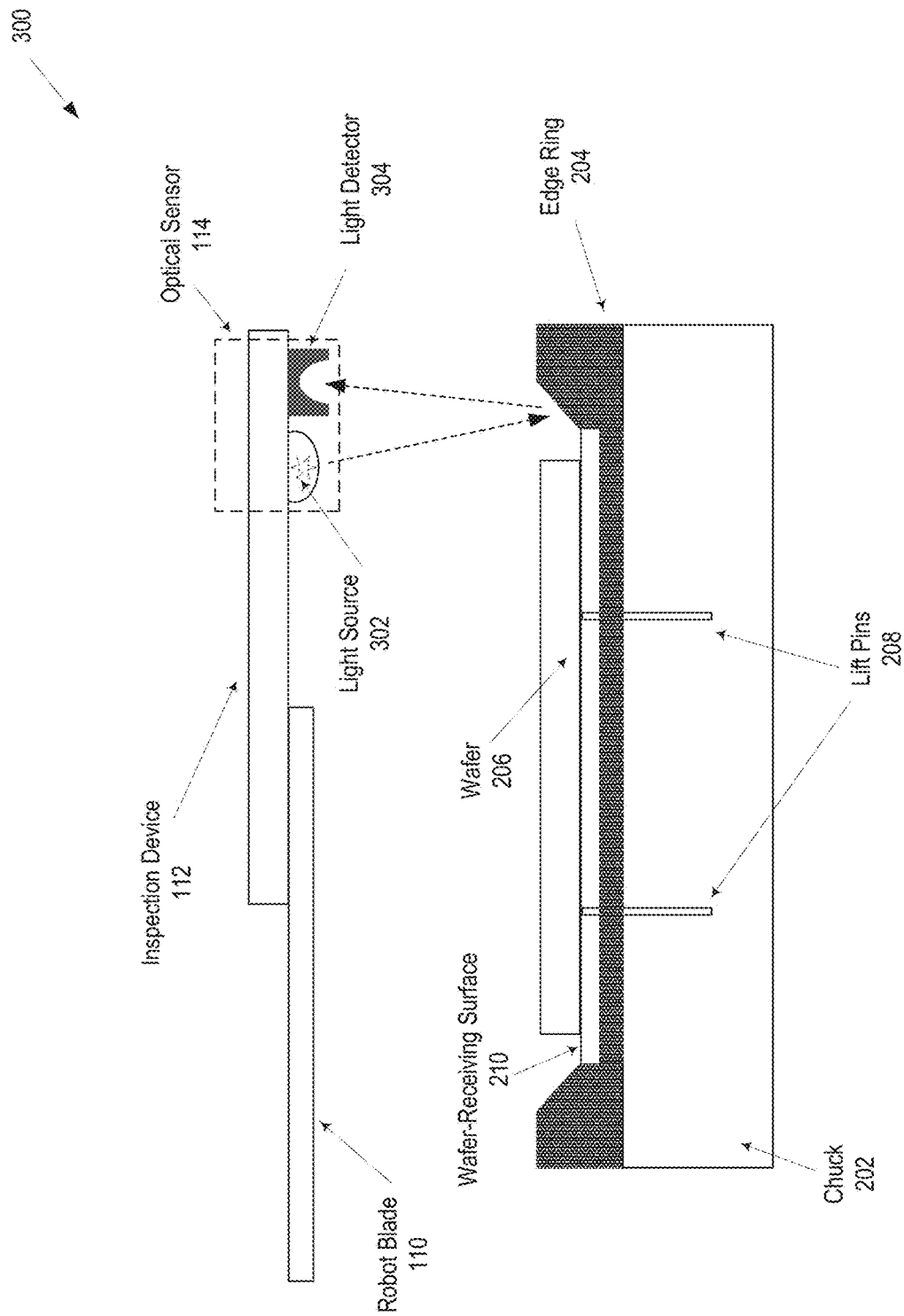
FIG. 3A illustrates an inspection device setup for performing optical inspection of the surface of the edge ring, in one exemplary implementation.

FIG. 3A illustrates an inspection device setup 300 for performing optical inspection of the surface of the edge ring 204, in one exemplary implementation. After the inspection device 112 is delivered to the processing chamber 106 by the robot blade 110, the surface of the edge ring 204 may inspected with the optical sensors 114. FIG. 3A illustrates one exemplary geometry of the edge ring 204. Specifically, in the setup 300, the edge ring 204 surrounds the wafer-receiving surface 210, which under the normal processing conditions is to receive the wafer 206. In some implementations, the wafer 206 may not be present when the inspection device 112 is inserted into the processing chamber 106. In such implementations, the robot blade 110 may be withdrawn after the inspection device 112 is delivered and placed on the wafer-receiving surface 210. The inspection device 112 may then be lifted on the lift pins above the wafer-receiving surface 210 and the edge ring 204. In other implementations, the inspection device 112 may be inserted while the wafer 206 is positioned on the wafer-receiving surface 210. This may have an advantage of additionally allowing the inspection device 112 to determine the gap between the wafer 206 and the edge ring 204. In such implementations, the robot blade 110 may remain inside the processing chamber 106 and provide support for the inspection device 112 while the inspection device hovers above the edge ring 204.

The inspection device 112 may have optical sensors 114 that may include one or more light sources 164 and light detectors 166. A light beam produced by the light source 164 may be a coherent beam, such as a laser beam, in some implementations. In other implementations, the light source 164 may produce natural light, linearly, circularly, or elliptically polarized light, partially-polarized light, focused light, and so on. The light source 164 may produce a continuous beam of light or a plurality of discrete pulsed signals. The light source 164 may produce a collimated beam of light, a focused beam of light, or an expanded beam of light. The light source 164 may produce a monochromatic beam having a frequency/wavelength within a narrow region of frequencies/wavelengths near some central frequency/wavelength, in some implementations. Alternatively, multiple monochromatic light beams may be used. In other implementations, the light source 164 may produce a beam with a broad spectral distribution, e.g., a white light. In some implementations, the beam may be in the visible part of the spectrum. In some implementations, the spectral distribution of the beam may include infrared or ultraviolet frequencies undetectable to a human eye.

In one implementation, the light source 164 may include a light-emitting diode (LED) which may produce a wide (uncollimated) incoherent beam having a range of wavelengths. The light (visible or infrared) produced by LED may, in some implementations, be collimated or focused by one or more lens of the light source 164 (not shown in FIG. 3A) to increase the intensity of the light incident on the inspected surface (and, therefore, increase the intensity of the light reflected from the surface), for the ease of detection.

In another implementation, the light source 164 may include a laser (e.g., a low-power laser diode), which may produce a narrow beam, e.g., a well-collimated beam, which may also have a narrow spectral width (compared with the light from a typical LED). A well-collimated beam with a narrow spectral width may provide a number of advantages. For example, a well-collimated beam may be capable of accessing narrow areas of the target surface (such as deep and narrow crevasses) that may be missed by a wide beam. Additionally, a spectrally-narrow beam may allow the use of narrow band optical filters to filter out spurious light (e.g., ambient light) that may enter the processing chamber 106, for example through one or more view ports in the chamber walls. Such an optical filter may be used as part of the light detector 166 (not shown explicitly on FIG. 3A), which may additionally have one or more focusing lenses.

The optical sensors 114 (that may include both the light source and the light detector 166) may be positioned at some working distance above the inspected target surface (such as the surface of the edge ring 204). The working distance may be determined by the focal distances of the lens used in optical sensors 114. For example, in some implementations, the working distance may be within 9-15 mm, although in other implementations shorter or longer working distances (e.g., distances in excess of 35 mm) may be used.

In some implementations, the optical sensor 114 may operate in a discrete sampling mode, with a sampling frequency that may be adjusted based on the speed of the inspection device (set by the speed of insertion or retraction of the robot blade 110). For example, if the sampling frequency is 500 Hz whereas the speed of the inspection device is 25 mm/sec, the spatial resolution of the optical inspection may be 25 mm/sec÷500 Hz=50 um. In other words, the inspection device 112 may be capable of measuring reflectance of the target surface once every 50 microns. In other implementations, the resolution of the target surface profile may be improved further by either decreasing the speed of the inspection device or increasing the sampling rate, or both. For example, if the sampling frequency is increased to 1 kHz whereas the speed of the inspection device is reduced to 5 mm/sec, the spatial resolution of the optical inspection will be 5 mm/sec÷1000 Hz=5 um. In other words, the inspection device 112 may be capable of measuring reflectance of the target surface once every 5 microns.

In some implementations, the speed of the inspection device and/or the sampling rate may vary depending on the specific target or target surface that is being inspected. For example, the speed of the inspection device may be lower (and/or the sampling rate may be higher) where a higher resolution is required, e.g. when the edge ring 204 is being inspected. In contrast, the speed may be increased (and/or the sampling rate may be reduced) for faster inspection, where a lower resolution may be sufficient, e.g., when the inspection device 112 passed over the wafer receiving surface.

The target surface inspection may be performed when the inspection device 112 is being inserted (i.e. on the forward motion) or when the inspection device 112 is being withdrawn (i.e. on the backward motion) or on both occasions, if a more thorough inspection is required.

Figure 3B:
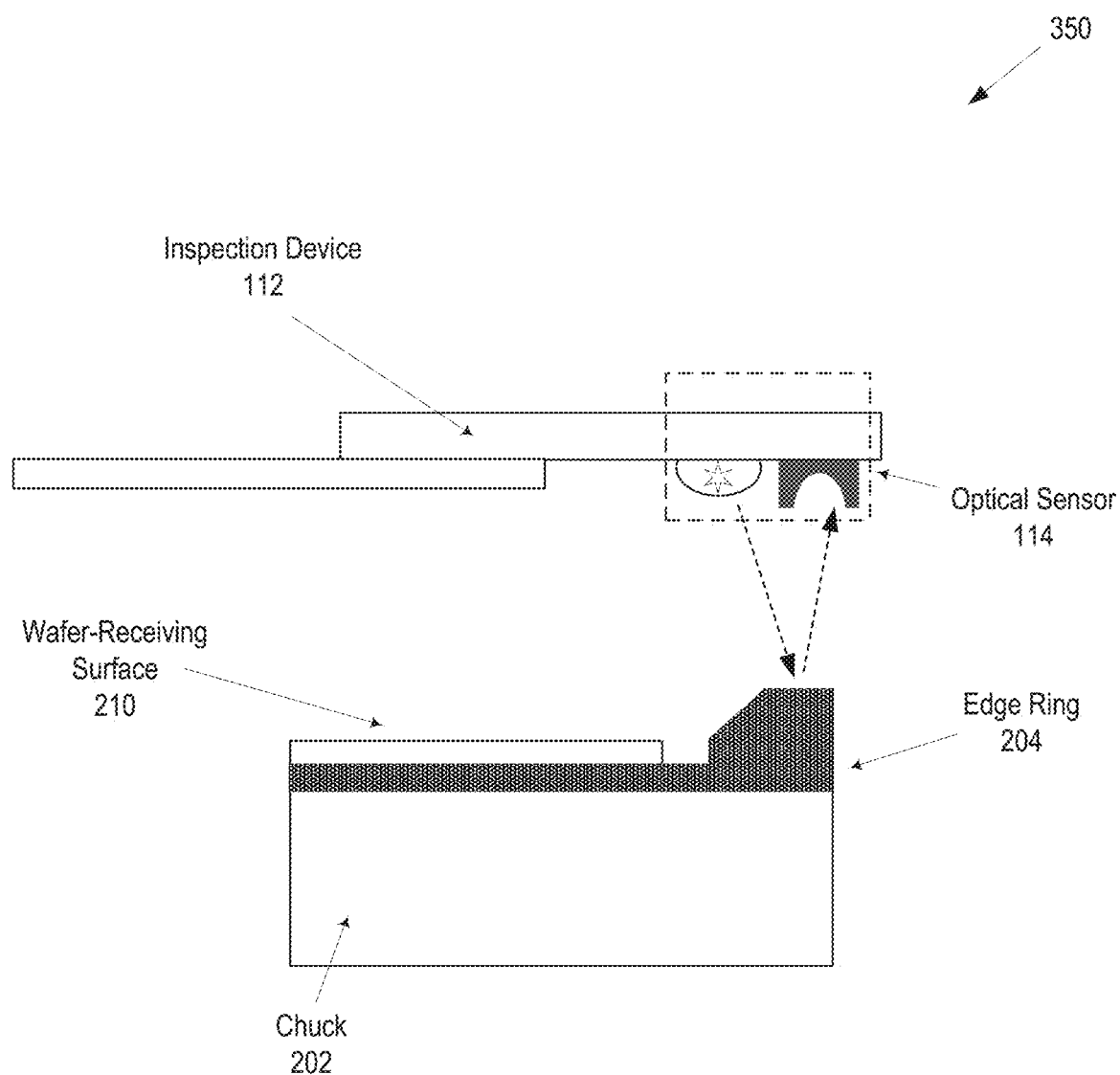
FIG. 3B illustrates an inspection device setup for clearance measurements in processing chambers, in one exemplary implementation.

FIG. 3B illustrates an inspection device setup 350 for clearance measurements in processing chambers, in one exemplary implementation. The inspection device setup 300 of FIG. 3B may also be used for calibration purposes. For example, in some implementations, the distance-measuring capability of the inspection device 112 may be used to characterize the inspection device itself and/or the robot 108 and its components, such as the robot blade 110. More specifically, the optical sensor(s) 114 may be used to determine the vertical distance (clearance) between the inspection device 112 and some reference plane. The reference plane may be a flat part of the edge ring 204 (as shown in FIG. 3B), the surface of the chuck 202, or some other stable reference plane whose location is likely to remain constant during use of the manufacturing machine 100. In contrast, the extendable robot blade 110 may be subject to drooping—deflection of the robot blade 110 in the vertical direction, away from an ideal horizontal plane. The amount of drooping may be different for different extensions of the blade. For example, blade drooping may be the most significant for maximum extensions of the blade. To determine the amount of drooping, the optical inspection device 112 may perform vertical distance measurements in the same or a similar manner as described above in reference to FIG. 3A and the edge ring profilometry, e.g., by using optical triangulation techniques.

The working distance—the vertical distance between the inspection device 112 (or its optical sensor(s) 114) and the target surface—may be up to 100 mm or even longer, in some implementations. The accuracy of determining vertical distances for calibration purposes (e.g., drooping) may be at least 25 micron, or less, in some implementations. By performing a series of vertical distance measurements for a plurality of extensions (in the horizontal direction) of the robot blade 110, the inspection device 112 may determine a dependence of the amount of drooping (e.g., of the distal end of the inspection device) on the robot blade extension. The data for the amount of drooping may subsequently be used for a variety of purposes. For example, the robot 108 and/or the robot blade 110 may be manually or automatically adjusted to remove/reduce drooping, in one implementation. In another implementation, the drooping data may be used to compensate for the drooping error, for example by adjusting the vertical positioning of the robot blade 110. Such adjusting may be performed when the robot 108 is first set up. In some implementations, a new readjustment (followed by taking a new drooping data) may be performed after mechanical modifications of the robot components and/or stations/chambers tools. In some implementations, a readjustment may be performed at regular time intervals.

Figure 4:
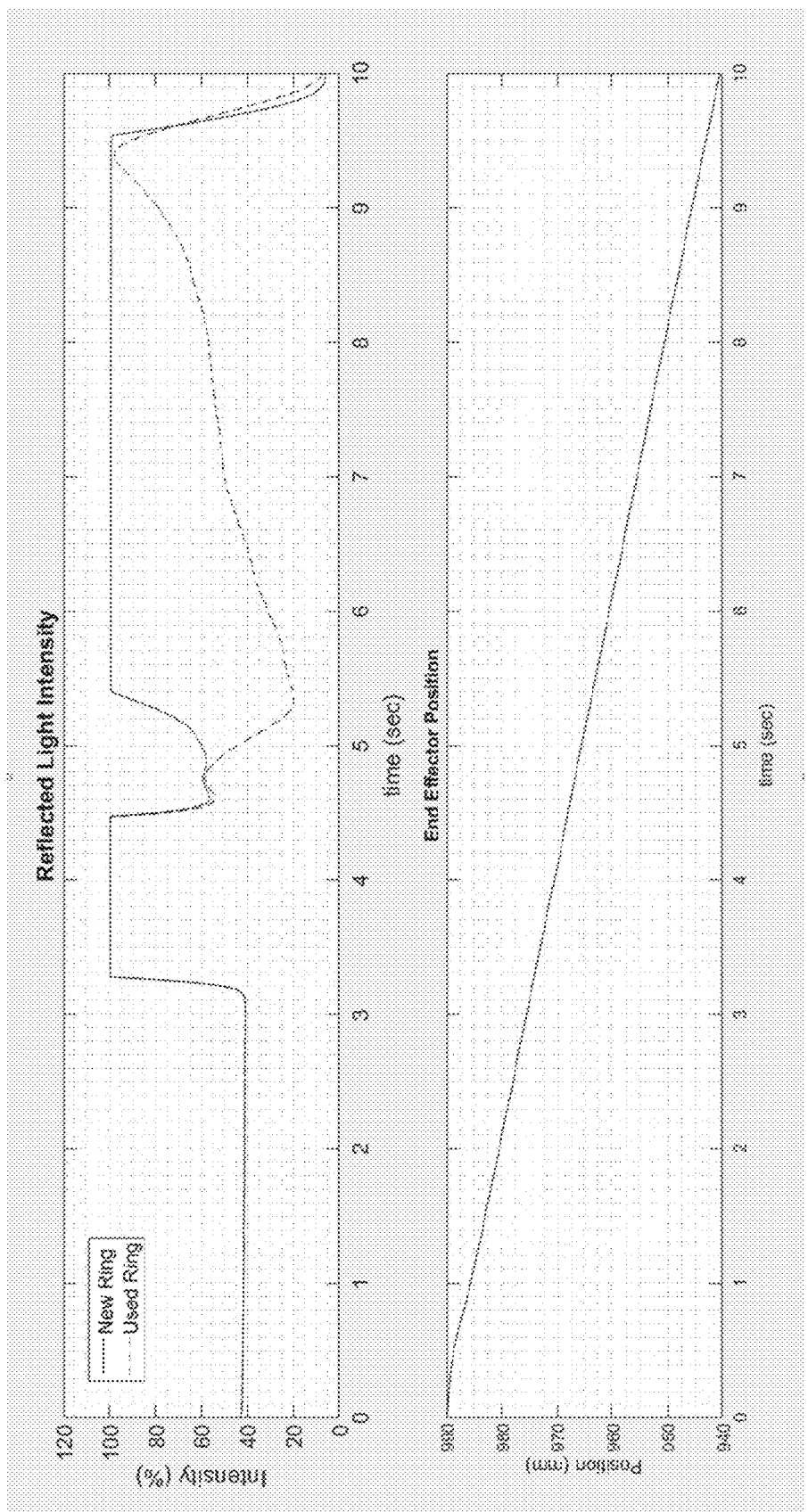
FIG. 4 illustrates inspection data obtained using the inspection device setup of FIG. 3A for performing optical inspection of the surface of the edge ring, in one exemplary implementation.

FIG. 4 illustrates inspection data obtained using the inspection device setup 300 for performing optical inspection of the surface of the edge ring 204, in one exemplary implementation. The data shown in FIG. 4 relates to two exemplary edge rings—a new ring and a worn ring. The data shown in FIG. 4 is intended to demonstrate a concept of optical inspection in an illustrative and non-limited way. The data shown in FIG. 4 may be collected and processed by the computing device 118 and one or more of its modules. For example, the blade control module 120 may set the inspection device speed. The set speed may be a fixed speed, in one implementation. In another implementation, the speed may be set based on instructions from the surface profile analysis module 124. For example, depending on the type of the target surface inspected, the surface profile analysis module 124 may instruct the blade control module 120 to increase or decrease the speed of the inspection device 112.

Using the known value of set speed, the blade control module 120 may map the time that has elapsed since some reference time—e.g., the time of the initial alignment of the inspection device 112 (or one of its optical sensors 114) with some reference point on the target surface. For example, the bottom panel of FIG. 4 may establish the position-to-time correspondence in an exemplary situation of the robot blade (end effector) moving the inspection device with the speed of 5 mm/sec.

The optical sensor control module 122 may set (alone or in conjunction with the surface profile analysis module 124) the sampling rate of the optical sensing. The upper panel of FIG. 4 illustrates a reflected light intensity (normalized by some arbitrary scale) of the light emitted by the light source 164 and detected by the light detector 166. The left plateau extending from 0 to approximately 3 sec corresponds to wafer-receiving surface 210 of the chuck 202. The wafer-receiving surface 210 in the illustrative example of FIG. 4 is smooth but relatively dull, which results in a constant but relatively low reflectivity. Between approximately 3 sec and 4.5 sec, the optical sensor 114 of the inspection device 112 measures reflectivity of the gap between the wafer-receiving surface 210 and the edge ring 204 whereas from 4.5 sec the optical sensor 114 beings exploring the profile of the edge ring 214. Depending on the state of the edge ring, the reflectance may vary significantly. For example, a new ring's reflectance (depicted in FIG. 4 with the solid line) may be uniform and high for a significant portion of the edge ring (from approximately 5.5 sec to 9.5 sec). In contrast, a used and worn-out ring may display a reflectance (depicted with the dashed line) that is significantly smaller and less uniform. Such non-uniformity and diminishing of the reflectance may indicate that the surface morphology of the edge ring 204 has deteriorated to an extent where performance of the edge ring 204 has become inadequate.

The relative decrease in the reflectance may be calibrated for various materials used for the edge rings, and the calibrated reflectance may be used to indicate when the edge ring is to be replaced. Such indications may be specific for a given type of material used in the edge rings. For example, an edge ring made of a polished quartz or a polished SiC may be characterized with a high reflectivity when the edge ring is new and a quick decrease in the reflectivity once the edge ring begins to wear out. On the other hand, an edge ring made of a bead-blasted material (quartz or SiC) may be characterized by a relatively low reflectivity when the edge ring is new but a slower decrease in the reflectivity with the time of use.

In addition to measuring reflectance of the target, the inspection device 112 may perform profilometry of the target surface. The profilometry technique allows extracting topographical data characterizing the target surface. For example, the optical sensors 114 may also measure (in addition to measuring the reflectance, as explained above) the local distance from the target surface to some reference point (or a reference plane) of the inspection device 112. This may allow to determine a one-dimensional profile h(x) of the target surface, where h is the height of the target surface, in one implementation, and x is the distance along some known line. For example, x may be the distance along a path of the optical sensor 114 relative to the target surface. In some implementations, the profile may be two dimensional, h(x,y), with x and y being two coordinates (e.g., Cartesian or polar coordinates) within a plane of the target surface. The height of the surface h may be measured using optical triangulation or interferometry techniques.

In the optical triangulation method, a microcontroller 152 (and/or a computing device 118) may infer a point where the line corresponding to a narrow incident beam (produced, e.g, by a laser diode light source 164) and the line corresponding to a reflected beam (e.g., detected by a light detector 166) intersect. The direction of the incident beam may be calibrated into the optical triangulation method and the direction of the reflected beam may be determined from the maximum reflected beam intensity, as detected by a distribution of the reflected beam intensity, e.g., captured by a CCD (charge-coupled device) detector, in one implementation.

In the interferometry method, a beam of light produced by the light source 164 may be processed by a miniature (inch-size) microinterferometer incorporated in the optical sensor 114. The microinterferometer may include a beam splitter, which may split the beam into at least two parts. A first part of the split beam may be reflected off the target surface before being mixed with the second part of the beam (which travels along a fixed reference path) in order to produce an interference picture. The microinterferometer may be mounted on the inspection device 112. Depending on the character of interference (maxima or minima) of the two parts of the beam, the distance from the light detector 166 to the target surface may be determined, and hence may be determined the local value of h.

Based on the triangulation technique or an interferometry method, the inspectin device may determine a morphology of the target surface and to map out various shapes of the target surface—slopes, peaks, valleys, ridges, and other features of the target surface.

The surface profile analysis module 124 may pass the reflectivity and/or profilometry data obtained by the optical sensor(s) 114 to a human operator, in one implementation. The human operator may assess the quality of the surface of the target (e.g., of the edge ring 204) and determine that the target needs to be replaced (or not). In other implementations, the surface profile analysis module 124 may perform the assessment without an input of the human operator. For example, the surface profile analysis module 124 may retrieve (from memory) a calibration data for the target surface and determine from a comparison of the calibration data with the reflectivity or profilometry data whether the target component needs to be replaced. For example, in some implementations, the surface profile analysis module 124 may compare a minimum reflectance or a minimum height of the target surface profile measured anywhere on the target surface with the corresponding calibration thresholds. In case the minima are below the thresholds (meaning that at least in some locations on the target surface its performance is sub-optimal), the surface profile analysis module 124 may output a recommendation to replace the target. In other implementations, the surface profile analysis module 124 may output a replacement recommendation if a pre-set fraction of the target surface has a sub-threshold reflectance and/or profile. In yet other implementations, the surface profile analysis module 124 may output a replacement recommendation if an average reflectance and/or profile of the target surface are below the corresponding calibration thresholds.

Figure 5:
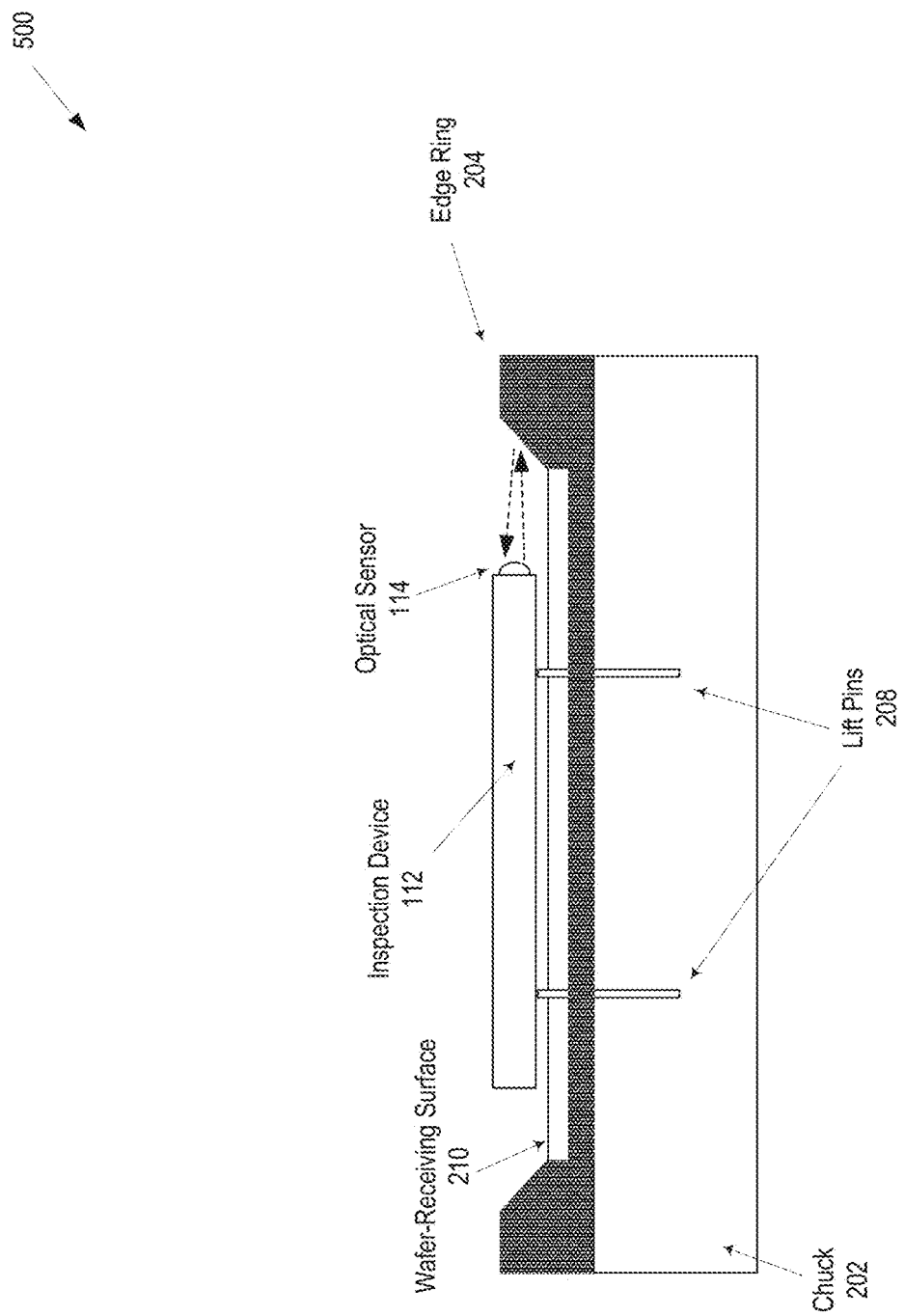
FIG. 5 illustrates an inspection device setup for performing horizontal optical inspection of the surface of the edge ring, in one exemplary implementation.

FIG. 5 illustrates an inspection device setup 500 for performing horizontal optical inspection of the surface of the edge ring 204, in one exemplary implementation. Whereas the inspection device setup 300 facilitates vertical optical inspection of the surface of the edge ring (or a chuck 202)—where the emitted and reflected light signals propagate along the vertical (or close to vertical) direction—the inspection device setup 500 facilitates horizontal scanning of the target surface. In one exemplary implementation, the robot blade 110 may deliver the inspection device 112 to the wafer-receiving surface 210. The robot blade 110 may subsequently withdraw from the processing chamber 106. The inspection device 112 may then be lifted using lift pins 208 to a height y determined by instructions from the blade control module 120 or the optical sensor control module 122. The optical sensor 114 mounted on the edge of the inspection device may emit light from the light source (not shown). The emitted light may reflect off the target surface (here, the surface of the edge ring 204) and propagate back to the light detector (not shown). The measurements may be repeated for a plurality of elevations y of the inspection device 112, and a dependence of the reflectivity on the elevation y may be determined. Similarly, the horizontal profile of the target surface w(y) may be determined. Subsequently, the surface profile analysis module 124 may provide the determined information to a human operator and/or assess if the target (e.g., the edge ring 204) may need to be replaced, as explained above in relation to vertical scanning.

Figure 6A:
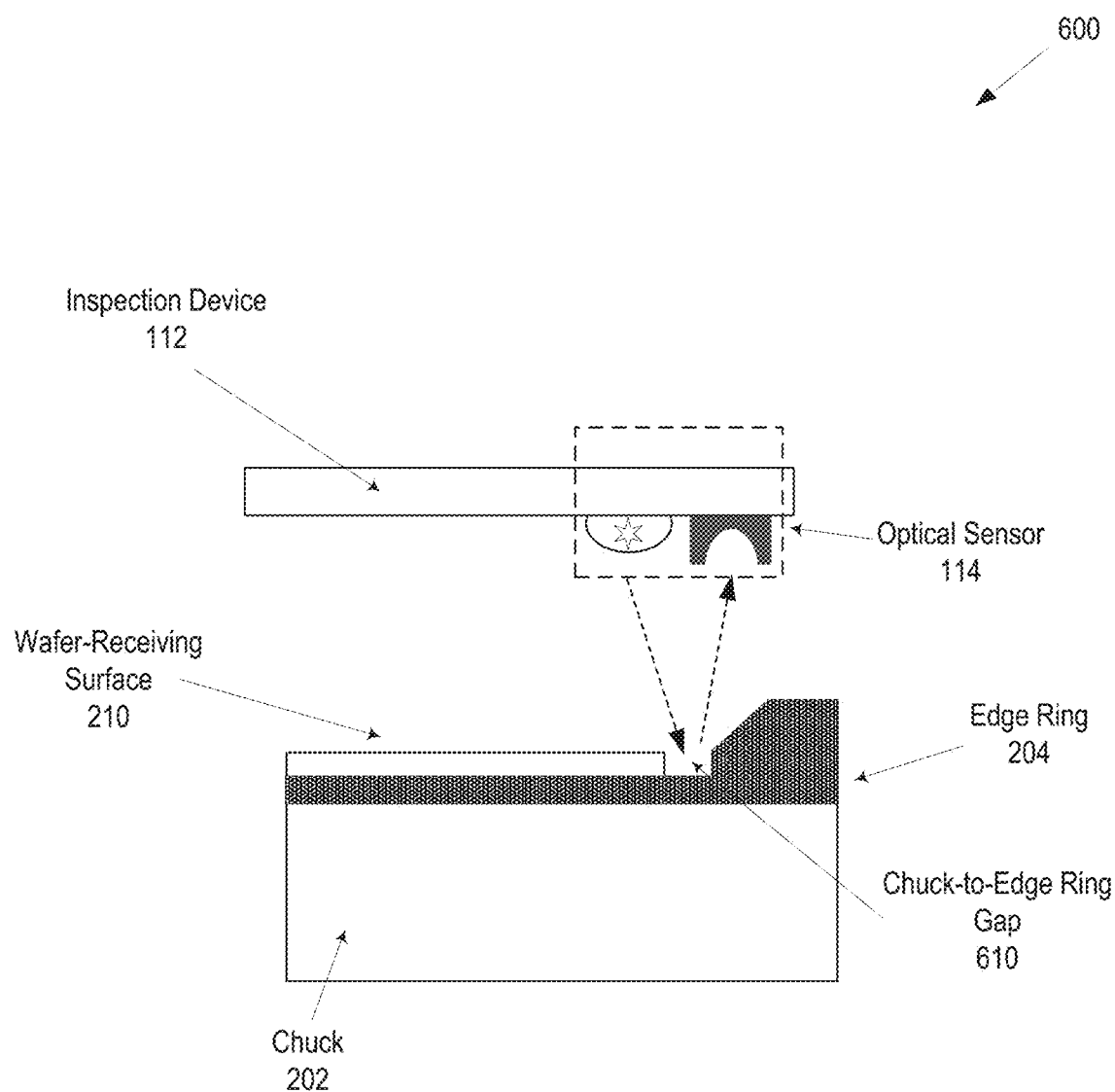
FIG. 6A illustrates an inspection device setup for performing optical inspection of a gap between the chuck and the edge ring ("chuck-to-edge ring gap"), in one exemplary implementation.

FIG. 6A illustrates an inspection device setup 600 for performing optical inspection of a gap 610 between the chuck 202 and the edge ring 204 ("chuck-to-edge ring gap"), in one exemplary implementation. When a new edge ring 204 is installed (e.g., in place of a worn-out edge ring), it may be important to ensure that the new edge ring 204 is properly centered around the chuck 202. More specifically, a properly set edge ring 204 has a chuck-to-edge ring gap 610 that is uniform (within the tolerances of the processing chamber specifications) around the circumference of the edge ring 204. The inspection device 112 may be positioned (by the robot 108) so that the optical sensor 114 is to inspect the chuck-to-edge ring gap 610 and to determine the size of this gap at a specific location of the edge ring 204 (and/or the chuck 202). The robot blade 110 may then rotate the inspection device so that the optical sensor 114 is to inspect the chuck-to-edge ring gap 610 at a different location of the edge ring 204. As a result, the computing device 118 may receive, from the inspection device 112, a plurality of data describing the accuracy of the edge ring centering around the chuck 202.

In some implementations, the entire plurality of data may be received by the same optical sensor 114, which is driven by the robot blade 110 to make a full circle around the circumference of the chuck 202/edge ring 204. In some implementations, multiple (e.g., N) optical sensors 114 may be involved in obtaining the chuck-to-edge ring gap data, so that each of the optical sensors may only have to be rotated by a fraction of the full circle (e.g. to 360/N degrees).

If the chuck-to-edge ring gap 610 is within acceptable tolerances of the specification, the computing device 118 may output an indication that the edge ring 204 is aligned properly. If, on the other hand, the chuck-to-edge ring gap 610 varies outside the acceptable tolerances, the computing device 118 may output a warning indication (e.g., to a human operator) that the edge ring 204 may need to be repositioned/recalibrated. The computing device 118 may also schedule a downtime to replace or readjust the edge ring 204. In some implementations, the computing device may perform readjustment without involving a human operator. For example, during the scheduled downtime (or, in some implementations, immediately after the optical inspection revealed a misalignment), the robot 108 may insert a calibration device and readjust the edge ring 204. In some implementations, inserting the calibration device may require withdrawing the optical inspection device 112. In other implementations, the calibration device may be inserted while the inspection device 112 remains inside the processing chamber 106. In such instances, the inspection device 112 may be capable of quickly re-inspecting the repositioned edge ring 204 and confirm if the realignment operation has been successful. In some implementations, the calibration device and the inspection device 112 may be a single device that in addition to the inspection functionality may have a capability of moving objects inside the processing chamber 106.

The computing device 118 may schedule edge ring alignment check-ups at specific (e.g., regular) time intervals to ensure that the edge ring 204 has not drifted away from its aligned location during manufacturing.

Figure 6B:
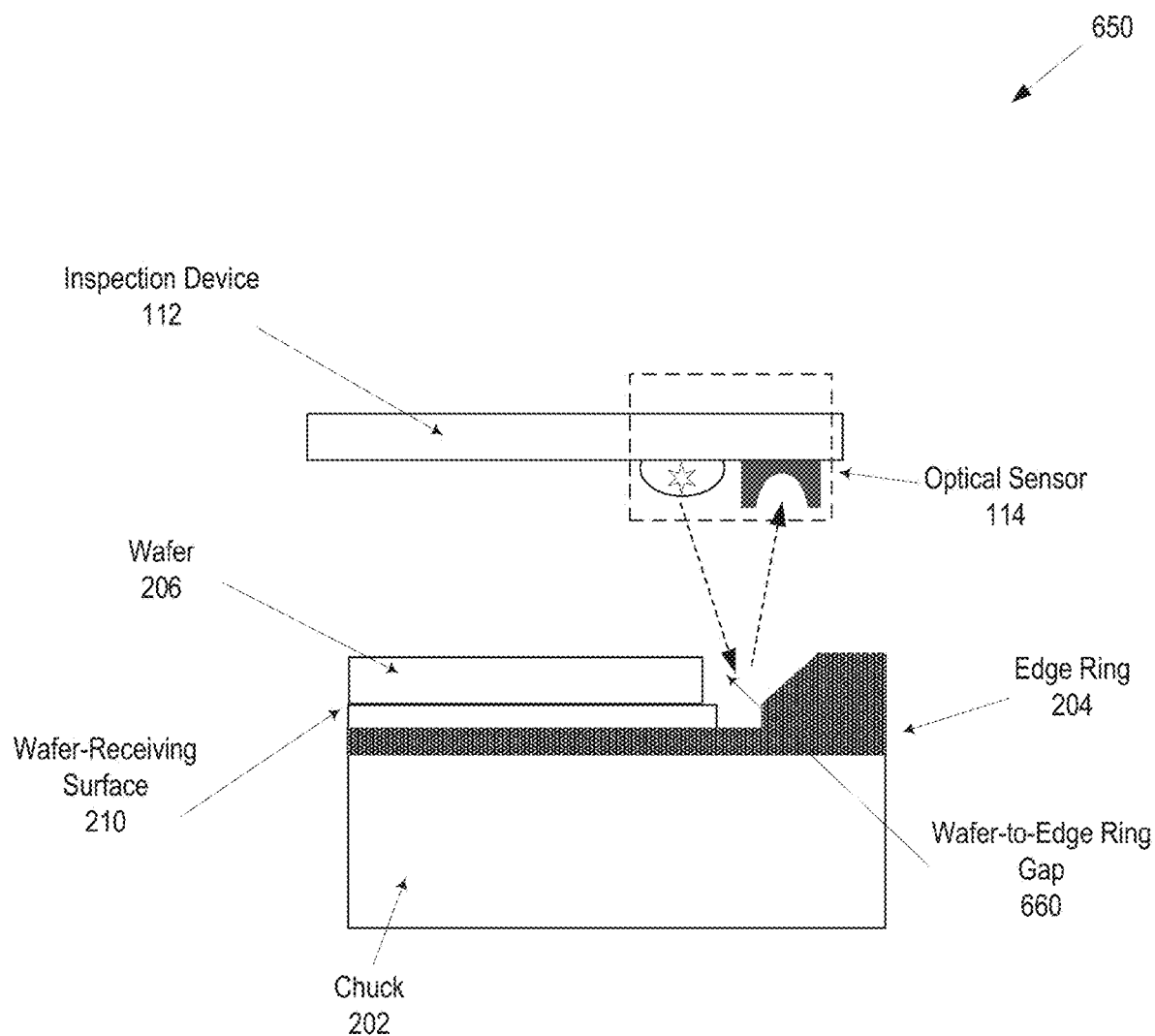
FIG. 6B illustrates an inspection device setup for performing optical inspection of a spacing between the wafer and the edge ring ("wafer-to-edge ring gap" or "pocket gap"), in one exemplary implementation.

FIG. 6B illustrates an inspection device setup 650 for performing optical inspection of a gap 660 between the wafer 206 and the edge ring 204 ("wafer-to-edge ring gap" or "pocket gap"), in one exemplary implementation. When a wafer 206 is introduced into the processing chamber 106 and placed on the wafer-receiving surface 210, it may be important to ensure that the wafer is properly centered on the chuck 202 inside the wafer pocket. More specifically, a properly placed wafer 206 has a wafer-to-edge ring gap 660 that is uniform (within the tolerances of the processing chamber specifications) around the circumference of the edge ring 204. The inspection device 112 may be positioned (by the robot 108) so that the optical sensor 114 is to inspect the wafer-to-edge ring gap 610 and to determine the size of this gap at a specific location of the edge ring 204 (and/or the chuck 202). The robot blade 110 may then rotate the inspection device so that the optical sensor 114 is to inspect the wafer-to-edge ring gap 660 at a different location of the edge ring 204. As a result, the computing device 118 may receive, from the inspection device 112, a plurality of data describing the accuracy of the wafer positioning on the chuck 202.

As in the case of detecting the chuck-to-edge ring gap 610, determining the wafer-to-edge ring gap 660 may be performed with one or multiple optical sensors 114. If misalignment of the wafer 206 is detected outside the tolerances of the processing chamber specification, the computing device 118 may readjust the positioning of the wafer 206. In some implementations, this may be achieved in the way similar to the above-described readjustment of the edge ring 204.

Figure 7:
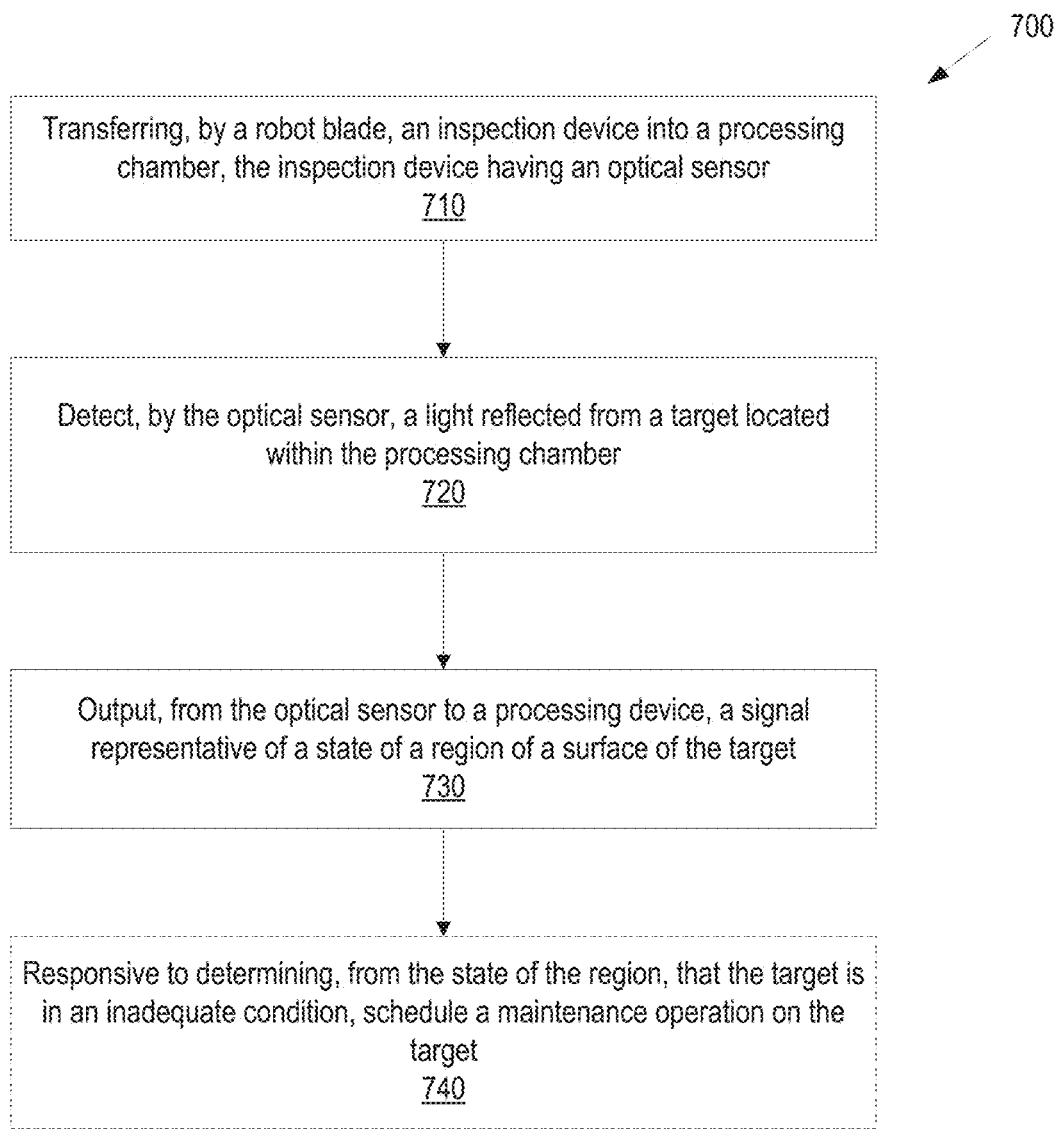
FIG. 7 is a flow diagram of one possible implementation of a method of optical inspection of manufacturing device chambers and components.

FIG. 7 is a flow diagram of one possible implementation of a method 700 of optical inspection of manufacturing device chambers and components. Method 700 may be performed using systems and components shown in FIGS. 1A-B, 2, 3A-B, 5, 6A-B or some combination thereof. Method 700 may be performed using a single optical sensor or a plurality of light sensors. The light sensors may be configured for vertical scanning, as illustrated, e.g., in FIGS. 2, 3A-B, or for horizontal scanning, as illustrated in FIG. 5, or some oblique scanning using similar setups to those described above. Some or all blocks of the method 700 may be performed responsive to instructions from the computing device 118 or the microcontroller 152, in some implementations. The computing device 118 may have one or more processing devices (e.g. central processing units) coupled to one or more memory devices. The method 700 may be performed without taking a manufacturing system (such as the manufacturing machine 100) off the production process. In some implementations, the optical inspection method may be performed while a wafer is present inside a processing chamber. In some implementations, the method 700 may be implemented with no wafer in the processing chamber, for example after the last wafer has been processed and removed from the processing chamber but before the next wafer is loaded into the processing chamber. The optical inspection method may be performed under conditions (e.g., at pressures and temperatures) that are similar to the actual conditions of the processing chamber during the manufacturing process. Accordingly, the manufacturing process may occur at low temperatures, or at temperatures that are less or significantly less than the room temperature. Alternatively, the manufacturing process may occur at the room temperature, above the room temperature, or significantly above it. In some implementations, the pressure inside the chamber may be less or significantly less than the atmospheric pressure, including low vacuum or high vacuum conditions.

The method 700 may include transferring, by a robot blade 110, an inspection device 112 into a processing chamber 106, the inspection device 112 having at least one optical sensor (710). In some implementations, the inspection device 112 may have dimensions (and a shape) that are similar to the dimensions of a wafer. Correspondingly, handling of the inspection device 112 by the robot 108 may be performed in a way that is similar to the manner in which the robot 108 handles a wafer. For example, the robot 108 may extend the robot blade 110 from the transfer chamber 104 into the loading station 102 (through a transfer port) and receive the inspection device 112 from the loading station. The robot blade 110 may subsequently withdraw back into the transfer chamber 104. The robot 108 may then rotate the robot blade 110 towards one of the processing chambers 106 and extend the robot blade 110 with the attached to it inspection device 112 into the processing chamber 106 (through another transfer port or valve).

The microcontroller of the robot 108 may control the motion of the robot blade so that one or more of the plurality of optical sensors 114 of the inspection device 112 is brought near a target surface located within the processing chamber 106.

The method 700 may continue with detecting, by one or more optical sensors, a light reflected from the target surface (720). The light reflected from the target surface may be directed at the target surface by one or more light sources that may be mounted on the inspection device 112. The light source(s) may direct a constant beam of light at the target surface, in one implementation. In another implementation, the beam directed by the light source(s) may be pulsed, with the frequency of pulsing (sampling rate) controlled by the microcontroller 152 of the robot 108. In some implementations, a microcontroller of the inspection device that is separate from the microcontroller 152 may control the sampling rate. In some implementations, the robot blade 110 may be moving while the inspection device 112 obtains light reflection data from the target surface. The speed of the robot blade 110 (and the inspection device 112 supported by the robot blade) may be tuned to a pre-determined resolution that may be adequate for a particular region of the target surface that is being inspected. For example, the speed may be lower for regions of the target surface that require a higher resolution, such as the regions of the edge ring that are proximate to the wafer edge, in one implementation. Conversely, the speed may be increased for regions that require a lower resolution, such as the regions of the edge ring that are farther away from the wafer.

The optical sensor may generate a signal that is representative of a state of the region of the target surface and output the signal to a processing device (730). The signal generated by the optical sensor may be analog or digital. In some implementations, the signal may carry information about the intensity of the light reflected from the target surface. For example, the signal may carry information about the ratio of the reflected light intensity to the incident light intensity (i.e., information about reflectivity of the surface). Such a signal may be representative of the state (e.g., condition) of the target surface. For example, a higher intensity of the reflected light may indicate a smooth surface that remains in a good working condition. On the other hand, a diminished reflectivity may indicate a rough surface whose functionality has deteriorated.

In another implementation, the state of the target surface may be a profile of the target surface determined via a plurality of measurements. A profile may be vertical, horizontal, or oblique. A vertical profile may represent the dependence of the height of the target surface on a horizontal coordinate (which may be discretized, per pre-determined resolution). For example, if y is the height of the target surface and x is a horizontal coordinate, the vertical profile of the target surface may be represented via a plurality of height measurements that determine the dependence of y on x: y(x). A horizontal profile may represent the dependence of the width (or thickness) of the target surface on a horizontal coordinate (which may also be discretized). A horizontal profile may represent a plurality of measurements of lateral dimensions of the target surface. For example, if x is the lateral position of the target surface and y is a vertical coordinate, the horizontal profile of the target surface may be represented via a plurality of lateral measurements that determine the dependence of x on y: x(y). An oblique profile may represent a similar dependence of some thickness of the surface on some arbitrary coordinate. Determining an oblique profile may be performed in instances where a surface of the target is tilted at some angle relative to the vertical or horizontal directions.

In some implementations, the target surface may include a plurality of regions of the chuck and a plurality of adjacent to them regions of the edge ring. The optical sensor may generate a signal that is representative of a plurality of gaps between each one of the plurality of regions of the edge ring and the adjacent one of the plurality of regions of the chuck. For example, the signal may contain information about the chuck-to-edge ring gaps at N locations around the circumference of the chuck. The computing device, which is to receive the signal, may determine, based on the chuck-to-edge ring gaps at N locations, a position of the edge ring relative to the chuck. For example, a geometric center of the edge ring may not be at the same point as a center of the chuck (in a situation where the chuck is circular). By comparing the sizes of the gaps at multiple locations, the computing device may determine the distance between the two centers (a radial offset between the chuck and the edge ring).

In some implementations, the chuck or the edge ring may not be perfectly circular, due to wear or by design. For example, the chuck or the edge ring may have a notch, a flat region, or any other structural feature that makes it important (or advantageous) to achieve a precise angular orientation of the edge ring to the chuck. For example, the chuck may have a recessed region and the edge ring may have a corresponding local alteration of the profile of its surface. The local alteration, for a proper operation of the edge ring, may have to be aligned with the recessed region. During installation of the edge ring (or from normal operations of the chamber), the alignment (orientation) of the edge ring (or the chuck) may be set incorrectly. By comparing the sizes of the gaps at multiple locations, the computing device may determine the angular offset in the relative orientation between the chuck and the edge ring.

In some implementations, the signal output by the optical sensor(s) may be a combination of the intensity signal and the profile signal. The same light detector, such as a CCD detector, may generate both signals. For example, the location of the brightest spot in the CCD array may indicate (in conjunction with the triangulation techniques) the angle of the reflected light beam (and hence the exact coordinates of the target surface) whereas the brightness of this spot may indicate the reflectivity of the target surface.

The signal generated by the optical sensor may be output to a processing device. The processing device may me the microcontroller of the inspection device 112, the microcontroller 152 of the robot 108, the CPU of the computing device 118, or any combination thereof. For example, the microcontroller of the inspection device and/or the microcontroller of the robot may perform initial pre-processing of the output signal, while the computing device 118 may further process the signal, e.g., by converting the pre-processed signal into a user-accessible format. In some implementations, where the signal output by the optical sensor is in analog format, the output signal may first be input on an analog-to-digital converter (ADC), which may convert the output signal into a digital format before providing the converted signal to the processing device.

In some implementations, the output signal may be processed by the processing device immediately upon generation. In some implementations, a human operator may receive the processed signal in real time and may be able to instruct the robot 108 and the inspection device 112 to collect additional data, e.g., a data about a different region of the same target surface, a higher-resolution data for the same region of the target surface, or a data about a different target surface. In other implementations, the output signal may not be processed immediately. Instead, the data carried by the output signal may first be stored in the memory buffer 154 and spooled to the processing device at some later time, wirelessly or using a wired connection. In some implementations, the data may be spooled to the processing device periodically, at pre-determined time intervals. In some implementations, the data may be spooled upon an occurrence of a triggering event. For example, the data may be spooled when the buffer 154 is full (or 80% full, etc.) or upon completion of the inspection (e.g., when the inspection device 112 is removed from the chamber being inspected) or some portion of the inspection (e.g., upon inspection of some particular region of the target). In some implementations, the spooling of data may happen when the inspection device is removed from the chamber for charging. For example, a docking station (e.g., a USB docking station) that connects the inspection tool to the charging station 180 may also serve as a data transferring station so that the data transfer may occur before, after, or concurrently with charging of the power element 156.

The method 700 may optionally continue with determining, from the state of the region of the inspected surface, that the target is in an inadequate condition, and, responsive to such determination, performing a maintenance operation on the target (740). The condition of the surface may be assessed based on a comparison of the processed signal with pre-stored calibration data. Such a comparison may indicate that the profile of the target surface has receded beyond an optimal value or the reflectivity of the target surface has fallen below a certain threshold. If a determination that the state of the target is sub-optimal is made, the processing device may schedule a maintenance operation. The maintenance operation may include replacement of the target, recalibration of the target, readjustment of the target, or some other maintenance operation. The scheduling of the maintenance operation may be performed by the processing device without an input of a human operator, in one implementation. In some instances, the scheduled maintenance operation may be performed by the robot 108 without involvement of the human operator. In other instances, the human operator may perform the maintenance operation.

In some implementations, the maintenance operation may be scheduled even when the condition of the target surface is adequate. For example, the data output by the optical sensor(s) may indicate that the target is in a misaligned state even though the physical conditions of the target surface do not require replacing the target. In such instances, the maintenance operation may still be scheduled to correct the alignment of the target.

The systems and methods disclosed herein may be used not only for quality monitoring during manufacturing, but may also be utilized for testing and development of various deposition chamber designs. The advantages of the disclosed implementations include, but are not limited to, the ability to inspect various tools and components of the manufacturing system, reduce system downtime, receive quick feedback during run-time in-chamber processing, an ability to implement chamber modifications during processing, measure the resulting changes to the chamber components, eliminate premature replacement of various tools and components, and so on.

FIG. 8 depicts a block diagram of an example processing device 800 operating in accordance with one or more aspects of the present disclosure. The processing device 800 may be the computing device 118 of FIG. 1A or a microcontroller 152 of FIG. 1B, in one implementation.

Example processing device 800 may be connected to other processing devices in a LAN, an intranet, an extranet, and/or the Internet. The processing device 800 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 800 may include a processor 802 (e.g., a CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processor 802 represents one or more general-purpose processing devices such as a microprocessor, central processing unit, or the like. More particularly, processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 802 may be configured to execute instructions implementing method 700 of optical inspection of manufacturing device chambers and components.

Example processing device 800 may further comprise a network interface device 808, which may be communicatively coupled to a network 820. Example processing device 800 may further comprise a video display 810 (e.g., a liquid crystal display (LCD), a touch screen, or a cathode ray tube (CRT)), an alphanumeric input device 812 (e.g., a keyboard), an input control device 814 (e.g., a cursor control device, a touch-screen control device, a mouse), and a signal generation device 816 (e.g., an acoustic speaker).

Data storage device 818 may include a computer-readable storage medium (or, more specifically, a non-transitory computer-readable storage medium) 828 on which is stored one or more sets of executable instructions 822. In accordance with one or more aspects of the present disclosure, executable instructions 822 may comprise executable instructions implementing method 700 of optical inspection of manufacturing device chambers and components.

Executable instructions 822 may also reside, completely or at least partially, within main memory 804 and/or within processing device 802 during execution thereof by example processing device 800, main memory 804 and processor 802 also constituting computer-readable storage media. Executable instructions 822 may further be transmitted or received over a network via network interface device 808.

While the computer-readable storage medium 828 is shown in FIG. 8 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. An inspection device capable of being transferred by a robot blade into a processing chamber, the inspection device comprising:
   one or more optical sensors, wherein each of the one or more optical sensors comprises a light source to generate sensing light and a light detector to detect light reflected from a plurality of locations of a target located within the processing chamber, and wherein the one or more optical sensors output, to a processing device, a plurality of time-mapped signals representative of a state of the plurality of locations of the target; and
   a controller configured to:
      map each of the plurality of time-mapped signals to a respective location of the plurality of locations of the target using a speed of the robot blade.

2. The inspection device of claim 1, wherein the light source and the light detector are arranged in a triangulation distance detection configuration, and wherein the light detector is configured to generate direction-dependent reflected light intensity data.

3. The inspection device of claim 1, wherein the inspection device is configured to wirelessly communicate the plurality of time-mapped signals to a wireless receiver.

4. The inspection device of claim 1, further comprising an engagement feature capable of being engaged to the robot blade when the robot blade imparts rotation to the inspection device relative to an axis of the inspection device to reposition the one or more optical sensors relative to the target.

5. The inspection device of claim 1, wherein the controller is further configured to output the plurality of time-mapped signals based on a speed of the robot blade and a predetermined resolution of the plurality of locations of the target.

6. The inspection device of claim 1, wherein the one or more optical sensors output the plurality of time-mapped signals with a rate of at least 500 Hz.

7. The inspection device of claim 1, wherein the one or more optical sensors output the plurality of time-mapped signals with a rate of at least 1000 Hz.

8. The inspection device of claim 1, wherein the controller is further configured to set a speed of the robot blade based on at least:
   a time resolution of the plurality of time-mapped signals, and
   a target spatial resolution of the plurality of locations of the target.

9. The inspection device of claim 1, wherein the controller is further configured to control a degree of rotation of the inspection device on the robot blade relative to an axis of the inspection device.

10. The inspection device of claim 1, wherein the light source and the light detector are arranged in a configuration in which the plurality of time-mapped signals are representative of a horizontal profile of the target.

11. The inspection device of claim 10, wherein the plurality of time-mapped signals characterizes the horizontal profile of the target, each of the time-mapped signals comprising a horizontal dimension of the target at a respective one of the plurality of locations of the target.

12. The inspection device of claim 1, wherein the light source and the light detector are arranged in a configuration in which the plurality of time-mapped signals are representative of a vertical profile of the target.

13. The inspection device of claim 12, wherein the plurality of time-mapped signals are output at a rate associated with a speed of a motion of the inspection device within the processing chamber.

14. The inspection device of claim 12, wherein the plurality of time-mapped signals characterizes the vertical profile of the target, each of the time-mapped signals comprising a vertical dimension of the target at a respective one of the plurality of locations of the target.

* * * * *